(12) United States Patent
Wang et al.

(10) Patent No.: US 12,394,761 B2
(45) Date of Patent: Aug. 19, 2025

(54) DISPLAY PANEL AND DISPLAY APPARATUS

(71) Applicant: BOE Technology Group Co., Ltd., Beijing (CN)

(72) Inventors: Yawei Wang, Beijing (CN); Ming Yang, Beijing (CN); Fuqiang Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 674 days.

(21) Appl. No.: 17/787,957

(22) PCT Filed: Sep. 8, 2021

(86) PCT No.: PCT/CN2021/117173
§ 371 (c)(1),
(2) Date: Jun. 22, 2022

(87) PCT Pub. No.: WO2022/089019
PCT Pub. Date: May 5, 2022

(65) Prior Publication Data
US 2023/0026822 A1 Jan. 26, 2023

(30) Foreign Application Priority Data
Oct. 29, 2020 (CN) .......................... 202011178175.3

(51) Int. Cl.
*H10K 59/12* (2023.01)
*G09G 3/3225* (2016.01)
(Continued)

(52) U.S. Cl.
CPC ....... *H01L 25/0753* (2013.01); *G09G 3/3225* (2013.01); *H10D 86/441* (2025.01);
(Continued)

(58) Field of Classification Search
CPC .. H01L 25/0753; H10K 59/65; H10K 59/131; H10K 59/12; H10D 86/441; H10D 86/60; G09G 3/3225; G09G 2300/0452
(Continued)

(56) References Cited

U.S. PATENT DOCUMENTS

| 8,816,331 B2 | 8/2014 | Choi et al. |
| 2012/0280215 A1 | 11/2012 | Choi et al. |
| 2021/0012706 A1 | 1/2021 | Yang et al. |

FOREIGN PATENT DOCUMENTS

| CN | 111180494 A | * 5/2020 | ......... H01L 27/3234 |
| CN | 111326560 A | * 6/2020 | ........... G09G 3/3233 |

(Continued)

OTHER PUBLICATIONS

Cite the machine translation Yang X (CN-111180494-A).*
(Continued)

*Primary Examiner* — Phuc T Dang
(74) *Attorney, Agent, or Firm* — XSENSUS LLP

(57) ABSTRACT

A display panel is provided and has a first display region including a plurality of first light-emitting elements, a third display region including a plurality of third light-emitting elements and a plurality of third pixel circuits, and a second display region therebetween, the second display region comprises a plurality of second light-emitting elements, a plurality of first pixel circuits and a plurality of second pixel circuits, each first pixel circuit is connected to at least one first light-emitting element through a conductive wire, and
(Continued)

each second pixel circuits is connected to at least one second light-emitting element; each third light-emitting element is connected to at least one third light-emitting element; the first display region, the second display region and the third display region increase sequentially in area, and the first pixel circuit and the second pixel circuit are both less than the third pixel circuit in area.

20 Claims, 4 Drawing Sheets

(51) Int. Cl.
    *H01L 25/075*      (2006.01)
    *H10D 86/40*      (2025.01)
    *H10D 86/60*      (2025.01)
    *H10K 59/65*      (2023.01)
    *H01L 25/16*      (2023.01)
    *H10K 59/131*      (2023.01)

(52) U.S. Cl.
    CPC .............. *H10D 86/60* (2025.01); *H10K 59/65* (2023.02); *G09G 2300/0452* (2013.01); *G09G 2300/0819* (2013.01); *G09G 2300/0842* (2013.01); *G09G 2300/0861* (2013.01); *H01L 25/167* (2013.01); *H10K 59/12* (2023.02); *H10K 59/131* (2023.02)

(58) Field of Classification Search
    USPC .......................................................... 257/91
    See application file for complete search history.

(56) References Cited

FOREIGN PATENT DOCUMENTS

| | | | | |
|---|---|---|---|---|
| CN | 111430436 A | | 7/2020 | |
| CN | 111508377 A | * | 8/2020 | ............... G09F 9/30 |
| CN | 111785761 A | | 10/2020 | |
| CN | 112038373 A | | 12/2020 | |
| CN | 112151592 A | | 12/2020 | |
| CN | 112271203 A | | 1/2021 | |
| KR | 20060015113 A | * | 2/2006 | |
| KR | 20190042784 A | * | 4/2019 | |

OTHER PUBLICATIONS

Cite the machine translation Long Y (CN-111508377-A).*
Cite the machine translation Qiu Y (CN-111326560-A).*
Cite the machine translation Kim Y (KR-20060015113-A).*
Cite the machine translation Park H (KR-20190042784-A).*
International Search Report and Written Opinion mailed on Nov. 26, 2021, in corresponding PCT/CN2021/117173, 8 pages.

* cited by examiner

DISPLAY PANEL AND DISPLAY APPARATUS

CROSS-REFERENCE

The present application is a U.S. National Stage of International Application No. PCT/CN2021/117173, filed on Sep. 8, 2021, which is filed based on Chinese Patent Application Serial No. 202011178175.3, filed on Oct. 29, 2020, and claims priority to the Chinese Patent Application, the entire content of which is incorporated herein by reference for all purposes. No new matter has been introduced.

TECHNICAL FIELD

The present disclosure relates to a field of display technology, and more particularly to a display panel and a display apparatus.

BACKGROUND

Current display apparatus is usually mounted with a camera thereon for shooting requirement. In order to maximize screen-to-body ratio, technologies such as notch in screen, water droplet screen and hole-digging in screen have emerged, and these technologies reduce area of surrounding zone occupied by a camera through digging holes in a local part of display region and placing the camera under hole-digging region, so as to improve the screen-to-body ratio. However, the above technologies needs to remove some display regions, causing some regions in the display screen unable to be displayed, and the screen-to-body ratio cannot be further improved.

It should be noted that information disclosed above is merely configured to enhance understanding of BACKGROUND of the present disclosure, which may include information that does not constitute a prior art known to those skilled in the related art.

SUMMARY

The present disclosure aims to provide a display panel and a display apparatus, so as to ensure that photosensitive sensor under the screen obtains sufficient light flux, and also to achieve full-screen display.

A first aspect of the present disclosure provides a display panel provided with a first display region, a third display region and a second display region located between the first display region and the third display region, wherein the first display region includes a plurality of first light-emitting elements; the second display region includes a plurality of second light-emitting elements, a plurality of first pixel circuits and a plurality of second pixel circuits, each of the first pixel circuits is connected to at least one of the first light-emitting elements through a conductive wire, and each of the second pixel circuits is connected to at least one of the second light-emitting elements; the third display region includes a plurality of third light-emitting elements and a plurality of third pixel circuits, each of the third light-emitting elements is connected to at least one of the third light-emitting elements; wherein an area of the first display region, an area of the second display region and an area of the third display region increase in sequence, and an area of the first pixel circuit and an area of the second pixel circuit are both less than an area of the third pixel circuit.

In an exemplary embodiment of the present disclosure, each of the first pixel circuits is connected to one of the first light-emitting elements through the conductive wire; each of the second pixel circuits is connected to one of the second light-emitting elements; each of the third pixel circuits is connected to one of the third light-emitting elements.

In an exemplary embodiment of the present disclosure, ratio of the area of the first pixel circuit to the area of the third pixel circuit is 0.4 to 0.6; ratio of the area of the second pixel circuit to the area of the third pixel circuit is 0.4 to 0.6.

In an exemplary embodiment of the present disclosure, the area of the first pixel circuit is equal to the area of the second pixel circuit.

In an exemplary embodiment of the present disclosure, the second display region is arranged to surround the first display region.

In an exemplary embodiment of the present disclosure, the second display region includes a first annular region and a second annular region, the first annular region surrounds the first display region, and the second annular region is located at a side of the first annular region away from the first display region and surrounds the first display region; wherein the first annular region has the plurality of first pixel circuits, and the second annular region has the plurality of second pixel circuits.

In an exemplary embodiment of the present disclosure, the plurality of first pixel circuits are uniformly distributed along a circumferential direction of the first display region.

In an exemplary embodiment of the present disclosure, the first display region is rectangular shaped, the second display region includes four side display regions connected end to end in sequence, and each side display region is located on a side of the first display region; each side display region includes a first subregion, a second subregion, a third subregion and a fourth subregion; the second subregion, the third subregion and the fourth subregion are located at a side of the first subregion away from the first display region; the second subregion, the third subregion and the fourth subregion are sequentially arranged in an extension direction of the first subregion, and an area of the second subregion is the same as an area of the fourth subregion; wherein each of the first subregion and the third subregion has multiple ones of the first pixel circuits uniformly arranged, and each of the second subregion and the fourth subregion has multiple ones of the second pixel circuits uniformly arranged.

In an exemplary embodiment of the present disclosure, density of the first light-emitting element in the first display region, density of the second light-emitting element in the second display region and density of the third light-emitting element in the third display region are the same.

In an exemplary embodiment of the present disclosure, the second display region is divided into at least two display subregions in a direction from the first display region to the third display region; wherein densities of the second light-emitting elements in the at least two display subregions increase in sequence in the direction from the first display region to the third display region; the density of the second light-emitting element in a display subregion, of the at least two display subregions, close to the first display region is greater than density of the first light-emitting element in the first display region, and the density of the second light-emitting element in a display subregion, of the at least two display subregions, close to the third display region is less than density of the third light-emitting element in the third display region.

In an exemplary embodiment of the present disclosure, the conductive wire is in a transparent structure.

A second aspect of the present disclosure provides a display apparatus, including any one of the foregoing display panels and a photosensitive sensor located on a backlight side of the display panel, and an orthographic projection of the photosensitive sensor on the display panel being located in the first display region.

It should be understood that the above general description and the following detailed description are only exemplary and explanatory and should not limit the present disclosure.

BRIEF DESCRIPTION OF THE DRAWINGS

Drawings herein are incorporated into and constitute a part of the specification, illustrate embodiments consistent with the present disclosure, and serve to explain principles of the present disclosure with the specification. It is obviously that the drawings below are merely some embodiments of the present disclosure. For those of ordinary skill in the art, other drawings may be further acquired based on these drawings without creative effort.

DETAILED DESCRIPTION

In order make objectives, technical solutions and advantages of the present disclosure be clearer, example embodiments will now be described in detail with reference to the accompanying drawings. However, the embodiments may be implemented in various forms, and those skilled in the art may easily understand a fact that manners and content may be changed into various forms without departing from purpose and scope of the present disclosure. Therefore, the present disclosure should not be merely construed as an limitation to what is described in the following embodiments. The embodiments and features in the embodiments of the present disclosure may be combined with each other in any combination in the case of non-contradiction.

The embodiment of the present disclosure provides a display panel, which may be either an OLED (Organic Light-Emitting Diode) display or a Micro LED (Micro Light-Emitting Diode) display.

Figure 1:
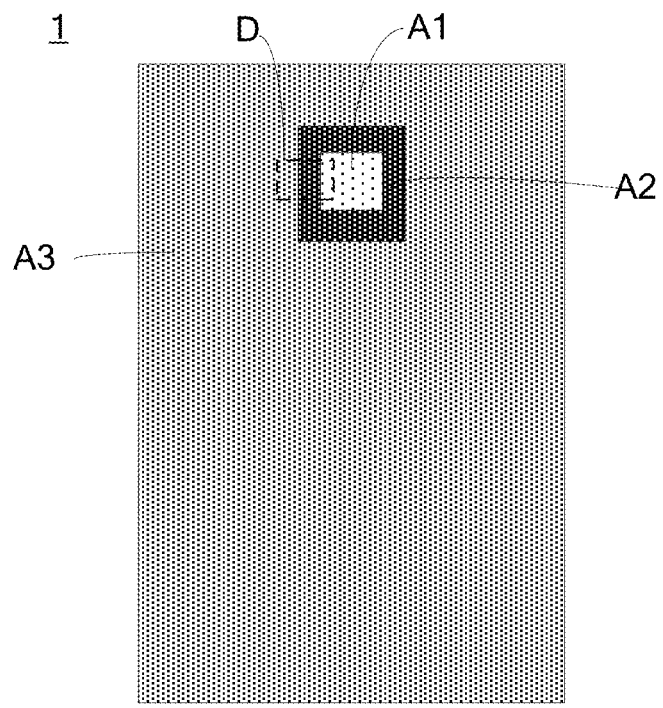
FIG. 1 shows a structural view of a display panel described in a first embodiment of the present disclosure.

As shown in FIG. 1, the display panel 1 may have a plurality of display regions, i.e., a first display region A1, a third display region A3, and a second display region A2 located between the first display region A1 and the third display region A3.

For example, as shown in FIG. 1, the second display region A2 may be arranged to surround the first display region A1, and the third display region A3 may be arranged to surround the second display region A2. It should be noted that the "surround" mentioned in the embodiment of the present disclosure refers to that one object completely encircles another object, and that is, the second display region A2 may completely encircle the first display region A1, and the third display region A3 completely encircles the second display region A2.

In addition, it should be understood that positions of the first display region A1, the second display region A2 and the third display region A3 are not limited to those shown in FIG. 1. The second display region A2 may only surround a part of the first display region A1, and the third display region A3 may only surround a part of the second display region A2, as long as ensuring that the second display region A2 is located between the first display region A1 and the third display region A3, depending on the specific circumstances.

Structure of each display region in the display panel 1 of the embodiment of the present disclosure will be described in detail below in combination with the accompanying drawings.

The first display region A1 may include a plurality of first light-emitting elements 10. The second display region A2 may include a plurality of second light-emitting elements 11, a plurality of first pixel circuits 12, and a plurality of second pixel circuits 13. Each of the first pixel circuits 12 is connected to at least one of the first light-emitting elements 10 through a conductive wire 14, and each of the second pixel circuits 13 is connected to at least one of the second light-emitting elements 11. It should be noted that, the second pixel circuit 13 and the second light-emitting element 11 at least partially overlap in a thickness direction of the display panel 1, or the second pixel circuit 13 and the second light-emitting element 11 do not overlap in the thickness direction of the display panel 1. The first pixel circuit 12 and the second light-emitting element 11 may at least partially overlap in the thickness direction of the display panel 1, or the first pixel circuit 12 and the second light-emitting element 11 may not overlap in the thickness direction of the display panel 1. The third display region A3 may include a plurality of third light-emitting elements 15 and a plurality of third pixel circuits 16, and each of the third pixel circuits 16 is connected to at least one of the third light-emitting elements 15. It should be noted that the third pixel circuit 16 and the third light-emitting element 15 at least partially overlap in the thickness direction of the display panel 1, or the third pixel circuit 16 and the third light-emitting element 15 do not overlap in the thickness direction of the display panel 1.

Optionally, the plurality of first pixel circuits 12 are connected to the plurality of first light-emitting elements 10 in one-to-one correspondence, the plurality of second pixel circuits 13 are connected to the plurality of second light-emitting elements 11 in one-to-one correspondence, and the plurality of third pixel circuits 16 are connected to the plurality of third light-emitting elements 15 in one-to-one correspondence. That is, each first pixel circuit 12 may be connected to one first light-emitting element 10 through the conductive wire 14, each second pixel circuit 13 is connected to one second light-emitting element 11, and each third pixel circuit 16 is connected to one third light-emitting element 15.

It should be understood that the first pixel circuit 12, the second pixel circuit 13 and the third pixel circuit 16 usually include metal structures, such as transistors, capacitors and other metal structures, with poor light transmittance. However, the first light-emitting element 10, the second light-emitting element 11 and the third light-emitting element 15 typically include an anode, an organic light-emitting layer and a cathode arranged in sequence. The anode and cathode are usually made of material with good light transmittance.

For example, the materials of the anode and cathode may include ITO (Indium Tin Oxide) or IZO (Indium Zinc Oxide) and other materials, or may be made of other materials with good light transmittance, which is not limited herein.

Based on the above disclosure, the first display region A1 of the embodiment of the present disclosure only has the first light-emitting element 10, and is not provided with the first pixel circuit 12 for driving the first light-emitting element 10. Thus, the first display region A1 may have a relatively high light transmittance, and a photosensitive sensor such as a camera may be arranged under the first display region A1 to improve the product image quality. The second display region A2 is arranged close to the first display region A1, and the second display region A2 has the second light-emitting element 11 and the second pixel circuit 13 connected to the second light-emitting element 11. In addition, there is the first pixel circuit 12 connected to the first light-emitting element 10 of the first display region A1, and that is, the second display region A2 may ensure normal display of itself while providing space for a driving circuit of the first display region A1 to ensure normal display of the first display region A1. The third display region A3 has the third light-emitting element 15 and the third pixel circuit 16 connected to the third light-emitting element 15 to ensure normal display of the third display region A3.

In order to achieve the connection between the first light-emitting element 10 and the first pixel circuit 12, a part of the conductive wire 14 is located in the first display region A1.

In order to improve the light transmittance of the first display region A1, the conductive wire 14 may be set as a transparent structure, and that is, material of the conductive wire 14 may be ITO or IZO, or other transparent conductive materials, which is not limited herein. It should be noted that the conductive wire 14 may be single-layer or multi-layer, depending on the specific circumstances.

In the embodiment of the present disclosure, by dividing the display panel 1 into the above-mentioned three display regions, it is possible to ensure that the photosensitive sensor under the screen obtains sufficient light flux, and also to achieve full-screen display. By placing the first pixel circuit 12, configured for driving the first light-emitting element 10 of the first display region A1 to emit light, in the second display region A2 close to the first display region A1, compared with placing the first pixel circuit 12 in the third display region A3, a routing length of the conductive wire 14 may be reduced, which lower design difficulty may while reducing cost.

It should be understood that, the first display region A1 according to the embodiment of the present disclosure is mainly configured to be opposite to the photosensitive sensor such as the camera to ensure the imaging effect while achieving the display, and that is, an area of the first display region A1 may be mainly determined by size of the photosensitive sensor such as camera. Due to a relatively small size of the photosensitive sensor, such as camera, the area of the first display region A1 of the embodiment of the present disclosure may be designed to be relatively small, while the second display region A2 has to arrange the second pixel circuit 13 that drives the second light-emitting element 11 within this area to emit light and the first pixel circuit 12 that drives the first light-emitting element 10 in the first display region A1. Thus, in order to lower the design difficulty of the pixel circuit in the second display region A2, an area of the second display region A2 may be designed to be relatively larger. Specifically, the area of the second display region A2 may be larger than that of the first display region A1, as shown in FIG. 1.

In addition, since there are two kinds of pixel circuits (i.e., the first pixel circuit 12 and the second pixel circuit 13) arranged in the second display region A2, the third display region A3 only needs to arrange one kind of pixel circuit (i.e., the third pixel circuit 16). Thus, in order to ensure the overall display effect of the product, an area of the third display region A3 may be designed to be larger than that of the second display region A2, as shown in FIG. 1. That is, in the embodiment of the present disclosure, the third display region A3 accounts for the largest proportion, which may be understood as a main display region of the display panel 1. Specifically, the sum of the area of the first display region A1 and the area of the second display region A2 may be smaller than the area of the third display region A3.

Since the third display region A3 is the main display region of the display panel 1, in order to ensure that the whole display panel 1 has a good display effect, it is necessary to ensure that the third display region A3 is displayed well. To this end, the third pixel circuit 16 is usually provided with enough elements to better drive the third light-emitting element 15 to emit light and ensure the display effect, For example, the third pixel circuit 16 may be a 7T1C pixel circuit, and that is, the third pixel circuit 16 includes seven transistors and one capacitor.

Figure 2:
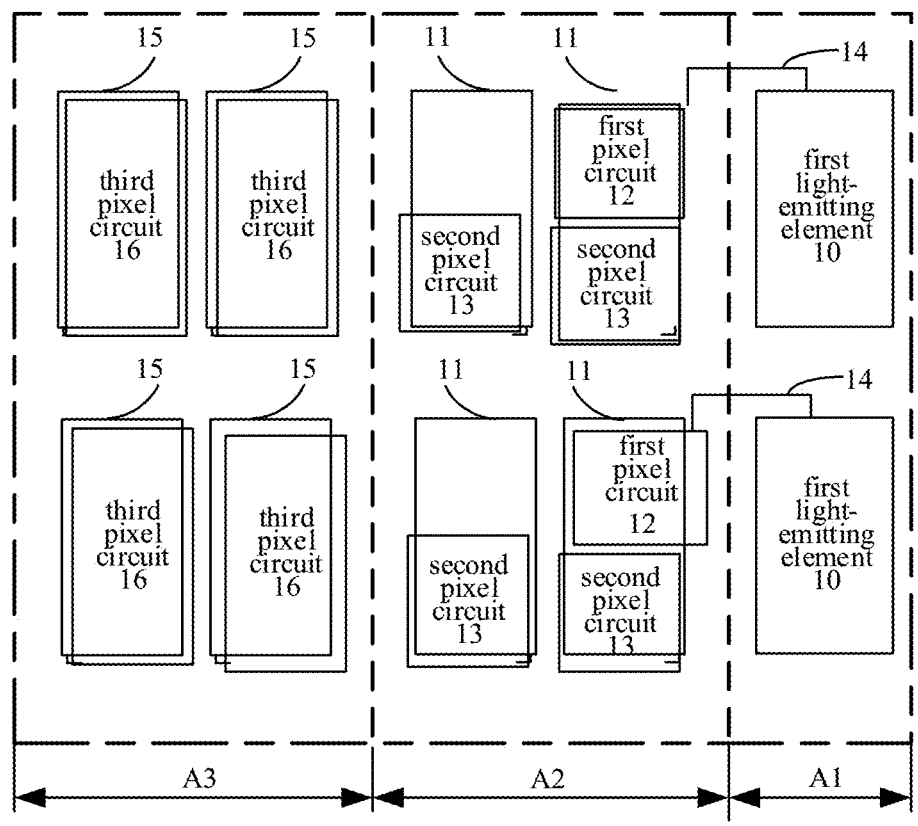
FIG. 2 shows an enlarged structural view of part D in the display panel shown in FIG. 1.

In order to enable the second display region A2 to arrange both the first pixel circuit 12 and the second pixel circuit 13 within a limited area, in the embodiment of the present disclosure, the areas of the first pixel circuit 12 and the second pixel circuit 13 are designed to be relatively small. Specifically, the area of the first pixel circuit 12 and the area of the second pixel circuit 13 are designed to be less than the area of the third pixel circuit 16, as shown in FIG. 2.

For example, in order to enable the area of the first pixel circuit 12 and the area of the second pixel circuit 13 to be less than the area of the third pixel circuit 16, number of each element in the first pixel circuit 12 and the second pixel circuit 13 may be reduced. For example, the first pixel circuit 12 and the second pixel circuit 13 of the present disclosure may be in 2T1C structure, and that is, it include two transistors and one capacitor, which is not limited herein. The first pixel circuit 12 and the second pixel circuit 13 of the embodiment of the present disclosure may also be 7T1C pixel circuits, and an area of each element in the first pixel circuit 12 and the second pixel circuit 13 is less than that of the corresponding element in the third pixel circuit 16. For example, an area of the transistor in the first pixel circuit 12 and the second pixel circuit 13 may be less than an area of the transistor in the third pixel circuit 16.

In the embodiment of the present disclosure, it is preferred that the first pixel circuit 12 and the second pixel circuit 13 are also 7T1C pixel circuits, so as to better adjust light-emitting effect of the first light-emitting element 10 and the second light-emitting element 11, thereby better ensuring display balance of each display region and improve the product quality.

Figure 3:
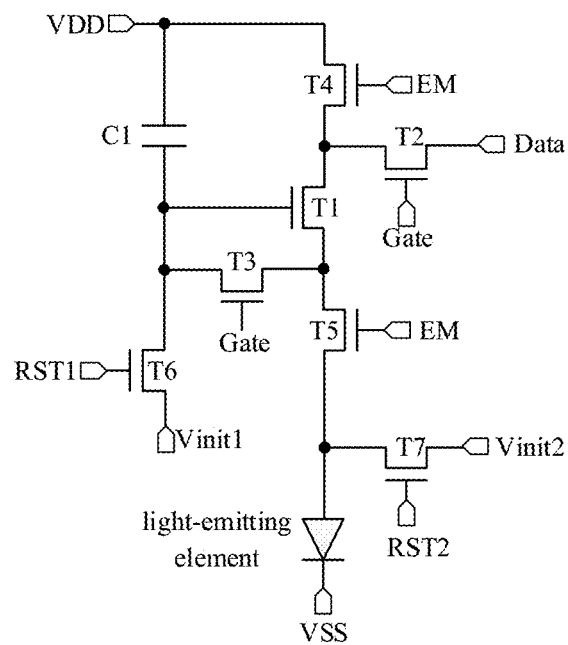
FIG. 3 shows an equivalent circuit diagram of a 7T1C pixel circuit provided by an embodiment of the present disclosure.
Figure 4:
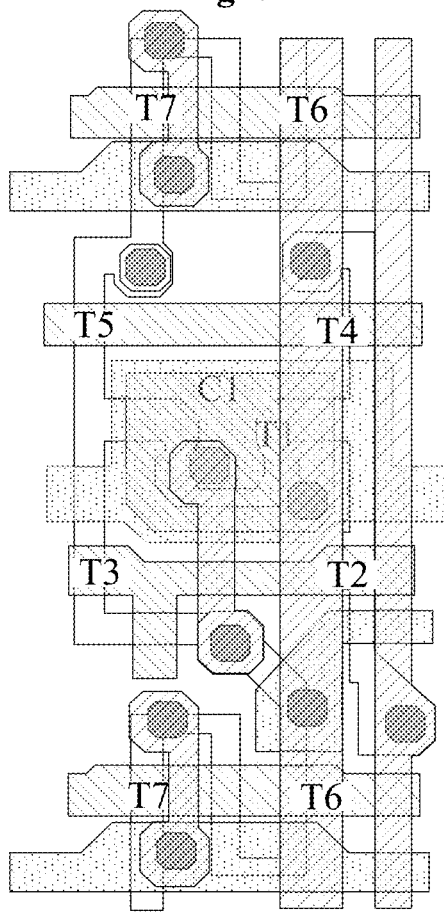
FIG. 4 shows a structural layout of a 7T1C pixel circuit provided by an embodiment of the present disclosure.

According to the 7T1C pixel circuit shown in FIG. 3 and FIG. 4, the 7T1C pixel circuit includes a driving transistor T1, a data writing transistor T2, a threshold compensation transistor T3, a first light-emitting control transistor T4, a second light-emitting control transistor T5, a first reset transistor T6, a second reset transistor T7, and a storage capacitor C1. The pixel circuit may be connected to a gate signal terminal (GATE), a data signal terminal (DATA), a reset signal terminals (RST1) and (RST2), a light-emitting control signal terminal (EM), a power supply terminal (VDD), an initial power supply terminals (Vinit1) and (Vinit2), and the light-emitting element, and the light-emitting element may also be connected to a power supply terminal (VSS). The pixel circuit may be configured to drive the connected light-emitting element to emit light in response to signals provided by the connected signal terminals.

In addition, according to characteristics of transistors, the transistors may be classified as a N-type transistor and a P-type transistor. The embodiments of the present disclosure are illustrated by using the P-type transistor as an example. Based on the description and teaching of this implementation mode in the present disclosure, it is easy for those skilled in the art to conceive that at least a part of the transistors in the pixel circuit structure of the embodiments of the present disclosure are the N-type transistors, and that is, the implementation mode of using the N-type transistors or a combination of the N-type transistors and the P-type transistors, which also fall within protection scope of the embodiments of the present disclosure.

In an embodiment of the present disclosure, ratio of the area of the first pixel circuit 12 to the area of the third pixel circuit 16 may be 0.4 to 0.6, such as 0.4, 0.5, 0.6, and the like. Ratio of the area of the second pixel circuit 13 to the area of the third pixel circuit 16 may be 0.4 to 0.6, such as 0.4, 0.5, 0.6, and the like.

The area of the first pixel circuit 12 may be equal to that of the second pixel circuit 13. In other words, the first pixel circuit 12 and the second pixel circuit 13 may adopt the same structure to reduce design difficulty and cost.

It should be noted that the area of the first pixel circuit 12 and the area of the second pixel circuit 13 may be larger than the area of the second light-emitting element 11, which is not limited herein, or the area of the first pixel circuit 12 and the area of the second pixel circuit 13 may be less than the area of the second light-emitting element 11 as shown in FIG. 2, depending on the specific circumstances.

Figure 5:
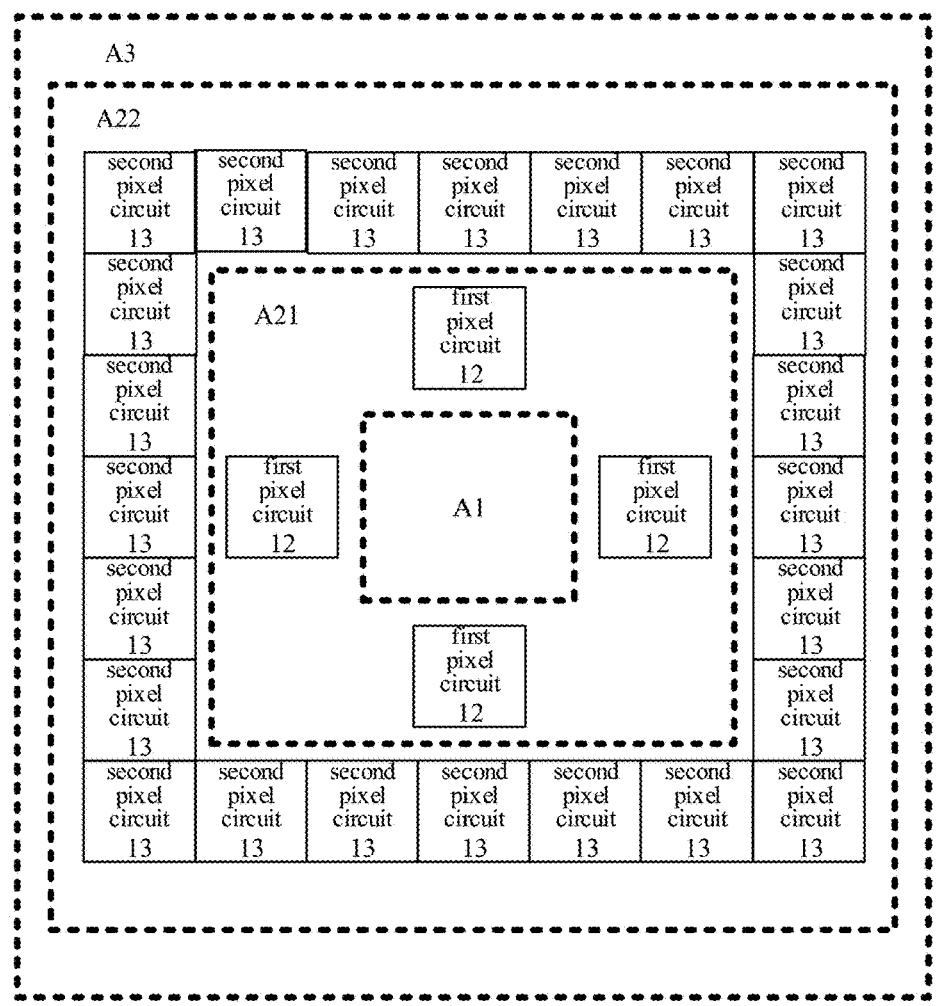
FIG. 5 shows a structural view of a display panel described in a second embodiment of the present disclosure.

In an embodiment of the present disclosure, when the second display region A2 is arranged to surround the first display region A1, as shown in FIG. 5, the second display region A2 may include a first annular region A21 and a second annular region A22, the first annular region A21 may surround the first display region A1, and the second annular region A22 may be located at a side of the first annular region A21 away from the first display region A1 and surround the first display region A1. The first annular region A21 has the plurality of first pixel circuits 12, and the second annular region A22 has the plurality of second pixel circuits 13. That is, each first pixel circuit 12 for connecting with each first light-emitting element 10 of the first display region A1 may be located in the first annular region A21 close to the first display region A1, and each second pixel circuit 13 for connection with each second light-emitting element 11 may be located in the second annular region A22 away from the first display region A1.

In the present embodiment, by arranging each first pixel circuit 12 in the first annular region A21 close to the first display region A1, the routing length of the conductive wire 14 may be reduced, which facilitates the routing design while reduces the cost.

Optionally, as shown in FIG. 5, the plurality of first pixel circuits 12 located in the first annular region A2t may be uniformly distributed along a circumferential direction of the first display region A1, such that the routing length of the conductive wire 14 connected to each first light-emitting element 10 in the first display region A1 is similar while the design difficulty of the conductive wire 14 is reduced. Thus, it is ensured that the light-emitting difference of each first light-emitting element 10 is small, to improve the display effect of the first display region A1.

It should be understood that both the first annular region A21 and the second annular region A22 have the second light-emitting element 11.

Figure 6:
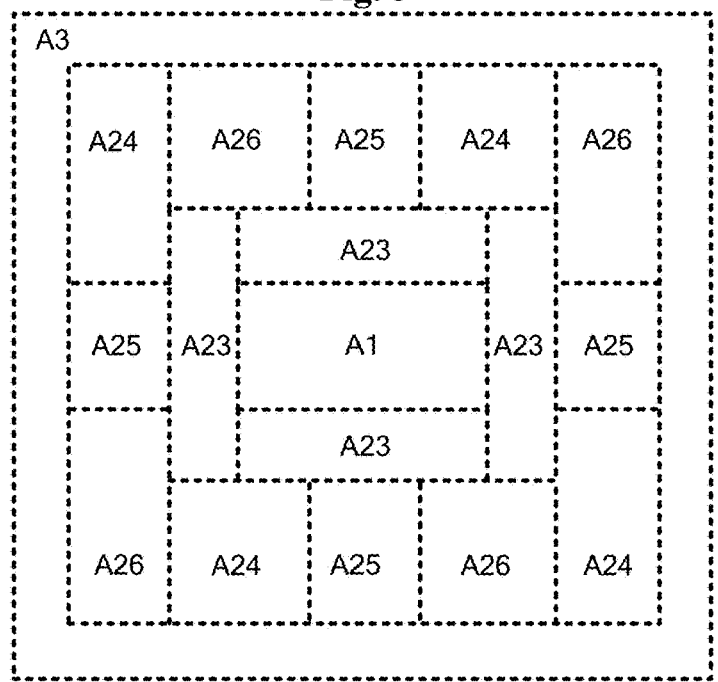
FIG. 6 shows a structural view of a display panel described in a third embodiment of the present disclosure.

In another embodiment of the present disclosure, the first display region A1 may be rectangular shaped. Specifically, the second display region A2 may include four side display regions connected end to end in sequence, and each side display region is located on a side of the first display region A1. As shown in FIG. 6, each side display region may include a first subregion A23 and a second subregion A24, a third subregion A25, and a fourth subregion A26, the second subregion A24, the third subregion A25, and the fourth subregion A26 are located at a side of the first subregion A23 away from the first display region A1. The second subregion A24, the third subregion A25, and the fourth subregion A26 are sequentially arranged in an extension direction of the first subregion A23, and an area of the second subregion A24 is the same as that of the fourth subregion A26. The first subregion A23 and the third subregion A25 may each have multiple ones of the first pixel circuits 12 uniformly arranged, and the second subregion A24 and the fourth subregion A26 may each have multiple ones of the second pixel circuits 13 uniformly arranged. Such design reduces the design difficulty of the conductive wire 14 and ensures similar routing length of each conductive wire 14, so as to ensure the display effect of the first display region A1 while reduce connection difficulty between each second pixel circuit 13 and the second light-emitting element 11, and further ensure that wiring length between each second pixel circuit 13 and the second light-emitting element 11 is similar to ensure the display effect of the second display region A2.

It should be understood that the second light-emitting element 11 is provided in the first subregion A23, the second subregion A24, the third subregion A25 and the fourth subregion A26 of each side display region.

It should be noted that shape of the first display region A1 is not limited to rectangular shape, but may also be circular shape, elliptical shape or other polygonal shape, the shape of the second display region A2 may match the shape of the first display region A1. For example, when the shape of the first display region A1 is rectangular shape, the shape of the second display region A2 may be a rectangular ring, and the like, which is not limited herein, the shape of the second display region A2 may also be other shapes, depending on the specific circumstances.

In the embodiments of the present disclosure, the first display region A1, each of the second display region A2 and the third display region A3 mentioned above has the light-emitting element with a variety of light-emitting colors. For example, each of the first display region A1, the second display region A2 and the third display region A3 may include a red light-emitting element R, a green light-emitting element and a blue light-emitting element B. and number of the red light-emitting element R in each display region is equal to number of the blue light-emitting element B, and number of the green light-emitting element G is twice the number of the red light-emitting elements R. In other words, in each display region, a pixel may be composed of one red light-emitting element R, one blue light-emitting element B and two green light-emitting elements G. The red light-emitting element R and the blue light-emitting element B are located in the same column, and the two green light-emitting elements G are located in the same column.

It should be understood that in each display region, each pixel may also be composed of one red light-emitting element R, one blue light-emitting element B and one green light-emitting element G. Optionally, the pixel may also include light-emitting elements with other colors, depending on the specific circumstances.

In an embodiment of the present disclosure, density of the first light-emitting element 10 in the first display region A1, density of the second light-emitting element 11 in the second display region A2, and density of the third light-emitting element 15 in the third display region A3 are the same. In other words, pixel density in the first display region A1 and pixel density in the second display region A2 are the same as pixel density in the third display region A3. It should be noted that the same pixel density refers to the same number of pixels per inch, so as to ensure that the display effect of each display region is substantially the same, thereby ensuring uniformity of display effect and improving user experience.

Figures 7, 8, 9:
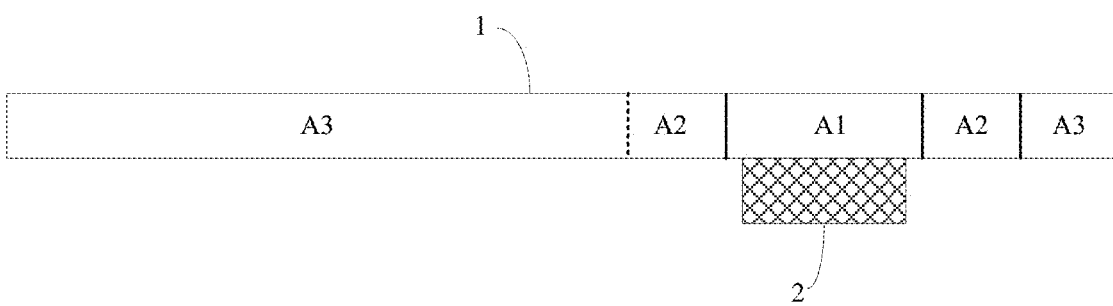
FIG. 7 shows a structural view of a display panel described in a fourth embodiment of the present disclosure.
FIG. 8 shows a structural view of a display panel described in a fifth embodiment of the present disclosure.
FIG. 9 shows a structural view of a display apparatus according to an embodiment of the present disclosure.

It should be understood that when the pixel density in the first display region A1 and the pixel density in the second display region A2 are the same as the pixel density in the third display region A3, the first light-emitting elements 10 with the same light-emitting color in the first display region A1, the second display region A2 and the third display region A3 have the same area and shape. As shown in FIG. 7, the red light-emitting element R in the first display region A1, the red light-emitting element R in the second display region A2 and the red light-emitting element R in the third display region A3 have the same area and shape, the blue light-emitting element B in the first display region A1, the blue light-emitting element B in the second display region A2 and the blue light-emitting element B in the third display region A3 have the same area and shape, and the green light-emitting element G in the first display region A1, the green light-emitting element G in the second display region A2 and the green light-emitting element G in the third display region A3 have the same area and shape.

In an embodiment of the present disclosure, the second display region A2 is divided into at least two display subregions in a direction from the first display region A1 to the third display region A3. In the direction from the first display region A1 to the third display region A3, density of the second light-emitting element 11 in each display subregion increases in sequence, and that is, the pixel density increases in sequence. Moreover, the density of the second light-emitting element 11 in a display subregion, of the at least two display subregions, close to the first display region A1 is greater than the density of the first light-emitting element 10 in the first display region A1, and that is, pixel density in the display subregion close to the first display region A1 is greater than pixel density of the first display region A1. The density of the second light-emitting element 11 in the display subregion close to the third display region A3 is less than the density of the third light-emitting element 15 in the third display region A3, and that is, pixel density in the display subregion close to the third display region A3 is less than pixel density of the third display region A3.

For example, the second display region A2 may include two display subregions, i.e., a first annular region A21 close to the first display region A1 and a second annular region A22 close to the second display region A2. Pixel density of the first annular region A21 is greater than that of the first display region A1 and less than that of the second annular region A22, and the pixel density in the second annular region A22 is less than that in the third display region A3.

It should be understood that when the pixel densities in the first display region A1, the first annular region A21, the second annular region A22 and the third display region A3 increase in sequence, areas of the first light-emitting element 10 with the same light-emitting color in the first display region A1, the first annular region A21, the second annular region A22 and the third display region A3 decrease in sequence. As shown in FIG. 8, the areas of the red light-emitting element R in the first display region A1, the red light-emitting element R in the first annular region A21, the red light-emitting element R in the second annular region A22 and the red light-emitting element R in the third display region A3 decrease in sequence, the blue light-emitting element B in the first display region A1, the blue light-emitting element B in the first annular region A21 The areas of the blue light-emitting element B in the second annular region A22 and the blue light-emitting element B in the third display region A3 decrease in sequence, and the areas of the green light-emitting element G in the first display region A1, the green light-emitting element G in the first annular region A21, the green light-emitting element G in the second annular region A22 and the green light-emitting element G in the third display region A3 decrease in sequence.

In the present embodiment, the first display region A1 is arranged to be a region with the lowest pixel density in an entire display region, so as to provide a higher light transmittance for the photosensitive sensor such as camera under the screen. The third display region A3 is arranged to be a region with the largest pixel density in the entire display region, thereby enabling to improve display image quality. Further, the pixel density in the second display region A2 increases in a direction from the first display region A1 to the third display region A3, so as to achieve a transition in display quality, and that is, the display image quality gradually becomes better in the direction from the first display region A1 to the third display region A3, so as to avoid poor display caused by sudden change of display image quality in different regions, and improve the display effect.

The embodiments of the present disclosure further provides a display apparatus, as shown in FIG. 9, including a display panel 1 described in any one of the above embodiments and a photosensitive sensor 2 located on a backlight side of the display panel 1. An orthographic projection of the photosensitive sensor 2 on the display panel 1 is located within the first display region A1.

For example, the photosensitive sensor 2 may be a camera arranged on the backlight side of the display panel 1 and corresponding to the first display region A1. Since the light transmittance of the first display region A1 corresponding to the camera is improved, a good shooting effect of the camera may be ensured. Thus, the display apparatus of the present disclosure has both good display effect and under-screen shooting effect.

It should be noted that, in addition to the structure mentioned above, the display apparatus further includes other necessary components and assemblies, such as a cover plate, a touch function layer, a polarizer, a housing, a main circuit board, a power cord, etc., and may be supplemented by those skilled in the art according to specific requirements of the display apparatus, which is not elaborated herein.

In the embodiment of the present disclosure, specific type of the display apparatus is not particularly limited, and can be any type of the display apparatus commonly used in the art, such as a TV set, a mobile phone, a computer, a watch, an on-vehicle device, a medical equipment, etc. Those skilled in the art may select according to a specific use of the display apparatus, which is not elaborated herein.

Although relative terms such as "on" and "under" are used in this specification to describe the relative relationship of one component to another component as illustrated, these terms are used in this specification only for convenience, for example according to a direction of the example described in the drawing. It can be appreciated that if the apparatus as shown is turned upside down, then the component described as "on" will become the component described as "under". When a certain structure is "on" another structure, it may refer to that the certain structure is integrally formed on the another structure, or that the certain structure is "directly" arranged on the another structure, or that the certain structure is "indirectly" arranged on the another structure through still another structure.

In the present specification, unless otherwise defined and limited, term "connection" should be understood broadly, such as a fixed connection, a detachable connection, or an integral connection; a mechanical connection or an electrical connection; direct connection or indirect connection via an intermediate member, or a communication between two components. For those skilled in the art, the specific meaning of the above terms in the present disclosure may be understood depending on the specific circumstances.

The terms "a" "an" "the", "said" and "at least one" are used to indicate the presence of one or more elements/components/and the like; the terms "comprise" "include" and "have" are used to indicate an open-ended inclusion meaning and refer to that additional elements/components/and the like may be present in addition to the listed elements/components % and the like.

The terms "first" "second", "third", and the like are used only for descriptive purposes and cannot be understood as indicating or implying relative importance.

After considering the specification and practicing the content disclosed herein, other embodiments of the present disclosure will be apparent to those skilled in the art. The present disclosure is intended to cover any variations, uses, or adaptations of the present disclosure, which follow the general principles of the present disclosure and include common general knowledge or conventional technical means in the art that are not disclosed in the present disclosure. The specification and embodiments are only considered as exemplary, and the true scope and spirit of the present disclosure are pointed out by the claims.

What is claimed is:

1. A display panel provided with a first display region, a third display region and a second display region located between the first display region and the third display region, wherein:
    the first display region comprises a plurality of first light-emitting elements;
    the second display region comprises a plurality of second light-emitting elements, a plurality of first pixel circuits and a plurality of second pixel circuits, each of the first pixel circuits is connected to at least one of the first light-emitting elements through a conductive wire, and each of the second pixel circuits is connected to at least one of the second light-emitting elements;
    the third display region comprises a plurality of third light-emitting elements and a plurality of third pixel circuits, each of the third light-emitting elements is connected to at least one of the third light-emitting elements;
    wherein an area of the first display region, an area of the second display region and an area of the third display region increase in sequence, and an area of the first pixel circuit and an area of the second pixel circuit are both less than an area of the third pixel circuit.

2. The display panel according to claim 1, wherein,
    each of the first pixel circuits is connected to one of the first light-emitting elements through the conductive wire;
    each of the second pixel circuits is connected to one of the second light-emitting elements;
    each of the third pixel circuits is connected to one of the third light-emitting elements.

3. The display panel according to claim 2, wherein,
    ratio of the area of the first pixel circuit to the area of the third pixel circuit is 0.4 to 0.6;
    ratio of the area of the second pixel circuit to the area of the third pixel circuit is 0.4 to 0.6.

4. The display panel according to claim 3, wherein the area of the first pixel circuit is equal to the area of the second pixel circuit.

5. The display panel according to claim 1, wherein the second display region is arranged to surround the first display region.

6. The display panel according to claim 5, wherein the second display region comprises a first annular region and a second annular region, the first annular region surrounds the first display region, and the second annular region is located at a side of the first annular region away from the first display region and surrounds the first display region;
    wherein the first annular region is provided with the plurality of first pixel circuits, and the second annular region is provided with the plurality of second pixel circuits.

7. The display panel according to claim 6, wherein the plurality of first pixel circuits are uniformly distributed along a circumferential direction of the first display region.

8. The display panel according to claim 5, wherein the first display region is rectangular shaped, the second display region comprises four side display regions connected end to end in sequence, and each side display region is located on a side of the first display region; each side display region comprises a first subregion, a second subregion, a third subregion and a fourth subregion; the second subregion, the third subregion and the fourth subregion are located at a side of the first subregion away from the first display region; the second subregion, the third subregion and the fourth subregion are sequentially arranged in an extension direction of the first subregion, and an area of the second subregion is the same as an area of the fourth subregion;
    wherein each of the first subregion and the third subregion is provided with multiple ones of the first pixel circuits uniformly arranged, and each of the second subregion and the fourth subregion is provided with the multiple ones of the second pixel circuits uniformly arranged.

9. The display panel according to claim 1, wherein density of the first light-emitting element in the first display region, density of the second light-emitting element in the second display region and density of the third light-emitting element in the third display region are the same.

10. The display panel according to claim 1, wherein,
    the second display region is divided into at least two display subregions in a direction from the first display region to the third display region; wherein
    densities of the second light-emitting elements in the at least two display subregions increase in sequence in the direction from the first display region to the third display region;

the density of the second light-emitting element in a display subregion, of the at least two display subregions, close to the first display region is greater than density of the first light-emitting element in the first display region, and the density of the second light-emitting element in a display subregion, of the at least two display subregions, close to the third display region is less than density of the third light-emitting element in the third display region.

11. The display panel according to claim 1, wherein the conductive wire is in a transparent structure.

12. A display apparatus, comprising a display panel provided with a first display region, a third display region and a second display region located between the first display region and the third display region and a photosensitive sensor located on a backlight side of the display panel, and an orthographic projection of the photosensitive sensor on the display panel being located in the first display region, wherein:
the first display region comprises a plurality of first light-emitting elements;
the second display region comprises a plurality of second light-emitting elements, a plurality of first pixel circuits and a plurality of second pixel circuits, each of the first pixel circuits is connected to at least one of the first light-emitting elements through a conductive wire, and each of the second pixel circuits is connected to at least one of the second light-emitting elements;
the third display region comprises a plurality of third light-emitting elements and a plurality of third pixel circuits, each of the third light-emitting elements is connected to at least one of the third light-emitting elements;
wherein an area of the first display region, an area of the second display region and an area of the third display region increase in sequence, and an area of the first pixel circuit and an area of the second pixel circuit are both less than an area of the third pixel circuit.

13. The display apparatus according to claim 12, wherein, each of the first pixel circuits is connected to one of the first light-emitting elements through the conductive wire;
each of the second pixel circuits is connected to one of the second light-emitting elements;
each of the third pixel circuits is connected to one of the third light-emitting elements.

14. The display apparatus according to claim 13, wherein, ratio of the area of the first pixel circuit to the area of the third pixel circuit is 0.4 to 0.6;
ratio of the area of the second pixel circuit to the area of the third pixel circuit is 0.4 to 0.6.

15. The display apparatus according to claim 14, wherein the area of the first pixel circuit is equal to the area of the second pixel circuit.

16. The display apparatus according to claim 12, wherein the second display region is arranged to surround the first display region.

17. The display apparatus according to claim 16, wherein the second display region comprises a first annular region and a second annular region, the first annular region surrounds the first display region, and the second annular region is located at a side close to the first annular region away from the first display region and surrounds the first display region;
wherein the first annular region is provided with the plurality of first pixel circuits, and the second annular region is provided with the plurality of second pixel circuits.

18. The display apparatus according to claim 17, wherein the plurality of first pixel circuits are uniformly distributed along a circumferential direction of the first display region.

19. The display apparatus according to claim 16, wherein the first display region is rectangular shaped, the second display region comprises four side display regions connected end to end in sequence, and each side display region is located on a side of the first display region; each side display region comprises a first subregion, a second subregion, a third subregion and a fourth subregion; the second subregion, the third subregion and the fourth subregion are located at a side of the first subregion away from the first display region;
the second subregion, the third subregion and the fourth subregion are sequentially arranged in an extension direction of the first subregion, and an area of the second subregion is the same as an area of the fourth subregion;
wherein each of the first subregion and the third subregion is provided with multiple ones of the first pixel circuits uniformly arranged, and each of the second subregion and the fourth subregion is provided with multiple ones of the second pixel circuits uniformly arranged.

20. The display panel according to claim 12, wherein density of the first light-emitting element in the first display region, density of the second light-emitting element in the second display region and density of the third light-emitting element in the third display region are the same.

* * * * *